(12) United States Patent
Chin et al.

(10) Patent No.: US 9,977,063 B2
(45) Date of Patent: May 22, 2018

(54) BATTERY WITH IMPROVED DISCHARGE UTILIZATION

(71) Applicant: Dell Products L.P., Round Rock, TX (US)

(72) Inventors: Fang Jui Chin, New Taipei (TW); Lin Chia Liang, Taoyuan (TW); Yu Wei Cheng, New Taipei (TW); Ho Shao Szu, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 244 days.

(21) Appl. No.: 14/729,801

(22) Filed: Jun. 3, 2015

(65) Prior Publication Data

US 2016/0359344 A1    Dec. 8, 2016

(51) Int. Cl.
*H02J 7/00*         (2006.01)
*G01R 31/00*        (2006.01)

(52) U.S. Cl.
CPC .................................... *G01R 31/00* (2013.01)

(58) Field of Classification Search
CPC ...................................................... H02J 7/0047
USPC ........................................................ 320/132
See application file for complete search history.

(56) References Cited

U.S. PATENT DOCUMENTS

| | | | | |
|---|---|---|---|---|
| 5,783,998 A * | 7/1998 | Nakajou | ............ | G01R 31/3655 324/426 |
| 6,804,100 B2 * | 10/2004 | Astala | ................... | H02J 7/0029 320/134 |
| 7,019,493 B2 * | 3/2006 | Astala | ................... | H02J 7/0029 320/134 |
| 7,382,270 B2 * | 6/2008 | Wendelrup | ............ | H02J 7/0004 320/106 |
| 2014/0191724 A1 * | 7/2014 | Wojcik | ................. | H05K 5/0086 320/114 |

\* cited by examiner

*Primary Examiner* — Yalkew Fantu
(74) *Attorney, Agent, or Firm* — Baker Botts L.L.P.

(57) ABSTRACT

The present disclosure may relate to a method of measuring voltage of a battery in an information handling system, the method may comprise directly detecting a voltage reading at one or more cells of the battery by a charge monitor circuit, the charge monitor circuit separate from the battery and detecting a voltage reading at a battery control board of the battery by a power management circuit. The method may also include determining a remaining life of the battery based on at least the voltage reading at the one or more cells of the battery by the charge monitor circuit and reporting the remaining life of the battery from the charge monitor circuit to the power management circuit. The present disclosure may also relate to associated systems and batteries.

18 Claims, 3 Drawing Sheets

BATTERY WITH IMPROVED DISCHARGE UTILIZATION

BACKGROUND

Field of the Disclosure

This disclosure relates generally to information handling systems and more particularly to batteries with improved discharge utilization and associated systems and methods.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may process, store, and communicate information and may include one or more computer systems, data storage systems, and networking systems.

In various information handling systems, various components or entire systems may be powered by batteries. These may include rechargeable batteries. There is a need in the art for improvements to the discharge utilization of such batteries.

SUMMARY

In accordance with one embodiment, the present disclosure may include a method of measuring voltage of a battery being used in an information handling system, the method comprising directly detecting a voltage reading at one or more cells of the battery by a charge monitor circuit, the charge monitor circuit separate from the battery and detecting a voltage reading at a battery control board of the battery by a power management circuit. The method may also include determining a remaining life of the battery based on at least the voltage reading at the one or more cells of the battery by the charge monitor circuit and reporting the remaining life of the battery from the charge monitor circuit to the power management circuit.

In accordance with another embodiment, the present disclosure may include a system for battery monitoring comprising a battery. The battery may comprise one or more rechargeable cells, a battery controller board, a battery voltage sensing connector connected to the battery controller board, and a cell voltage sensing connector connected directly to the one or more rechargeable cells and configured to output a voltage reading at the one or more cells. The system may also include a power management circuit, the power management circuit configured to detect the voltage at the battery voltage sensing connector, and a charge monitor circuit separate from the battery. The charge monitor circuit may be configured to detect the voltage reading at the cell voltage sensing connector, determine a remaining life of the battery based at least on the voltage reading at the cell voltage sensing connector, and report the remaining life of the battery to the power management circuit.

In accordance with yet another embodiment, the present disclosure may include a battery comprising one or more rechargeable cells, a battery controller board, a battery voltage sensing connector connected to the battery controller board, and a cell voltage sensing connector connected directly to the one or more rechargeable cells and configured to output the voltage at the one or more cells. The battery may be configured to provide a voltage reading at the one or more cells to a charge monitor circuit separate from the battery.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

Figure 1:
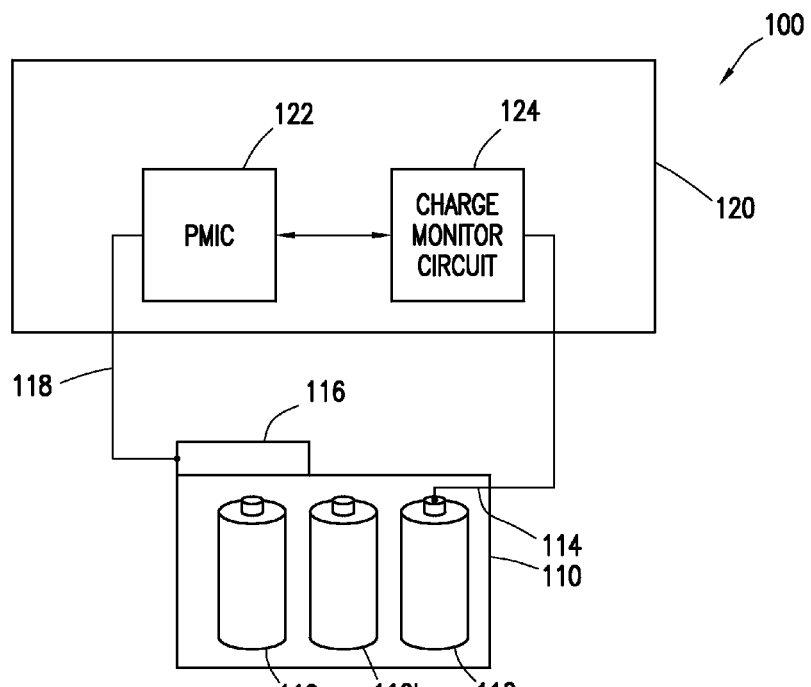
FIG. 1 illustrates an example system using a battery with improved discharge performance, in accordance with some embodiments of the present disclosure.

The present disclosure relates to a method of measuring the voltage of battery being used by a power consuming device. The present disclosure contemplates an additional voltage sensing pin directly connected to the cells of the battery, such that any voltage drop from the battery controller board may be discounted when determining the remaining life of the battery.

Throughout this disclosure, an alphabetic character following a numeral form of a reference numeral refers to a specific instance of an element and the numerical form of the reference numeral refers to the element generically. Thus, for example, device "12a" refers to an instance of a device class, which may be referred to collectively as devices "12" and any one of which may be referred to generically as a device "12".

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a server, a personal computer, a tablet, a PDA, a consumer electronic device, a mobile telephone, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Additionally, the information handling system may include firmware for controlling and/or communicating with, for example, hard drives, network circuitry, memory devices, I/O devices, and other peripheral devices. As used in this disclosure, firmware includes software embedded in an information handling system component used to perform predefined tasks. Firmware is commonly stored in non-volatile memory, or memory that does not lose stored data upon the loss of power. In some examples, firmware associated with an information handling system component is stored in non-volatile memory that is accessible to one or more information handling system components. In the same or other examples, firmware associated with an information handling system component is stored in non-volatile memory that is dedicated to and comprises part of that component.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), a compact disk, a CD-ROM, a DVD, random access memory (RAM), read-only memory (ROM), an electrically erasable programmable read-only memory (EEPROM), and/or a flash memory device such as a solid state drive (SSD). Computer-readable media may also include communications media such as wires, optical fibers, microwaves, radio waves, and other electromagnetic and/or optical carriers, and/or any combination of the foregoing.

Particular embodiments are best understood by reference to FIGS. 1-5 wherein like numbers are used to indicate like and corresponding parts.

FIG. 1 illustrates an example system 100 using a battery with improved discharge performance, in accordance with some embodiments of the present disclosure. System 100 may include a battery pack 110 and an associated power consuming device 120. Battery pack 110 may provide electrical power to power consuming device 120. In some embodiments, power consuming device 120 may be an information handling system. Battery pack 110 may be electrically coupled to power consuming device 120 such that power consuming device may receive power from battery pack 110 and may measure or sense certain characteristics of battery pack 110. Battery pack 110 may be detachably coupled to power consuming device 120, or may be an integral component of power consuming device 120.

Battery pack 110 may include any system, device or apparatus configured to house or otherwise enclose battery cells 112 (for example, battery cells 112a-c) and provide electrical connectivity between battery cells 112 and other components of system 100. As shown in FIG. 1, battery pack 110 may include battery cells 112. Battery cells 112 may include any system, device, or apparatus configured to store electrochemical energy and provide electrical energy. Battery cells 112 may be rechargeable, meaning that they may have their electrochemical energy restored by the application of electrical energy. Battery cells 112 may include a lead and sulfuric acid battery, nickel cadmium (NiCd) battery, nickel metal hydride (NiMH) battery, lithium ion (Li-ion) battery, lithium ion polymer (Li-ion polymer) battery, or any combination of the foregoing. In operation, battery cell 112 may provide electrical energy to one or more electrical or electronic components of power consuming device 120 or system 100. By way of example only, this may include a display, processor, memory, storage media, or the like, of power consuming device 120.

Battery pack 110 may also include a battery controller board 116. Battery controller board 116 may include any circuitry for controlling interaction of battery pack 110 with power consumption device 120. By way of non-limiting examples, this may include controlling a rate of discharge or controlling a rate of recharge; it may include ensuring compatibility with power consumption device 120 before power consumption device 120 is provided with power; it may include safety features such as a maximum temperature threshold or a minimum charge state below which the battery pack will no longer be rechargeable. Battery controller board 116 may include components such as wires, fuses, current sense resistors, or the like. Battery controller board 116 may also provide the connection through which power consuming device 120 receives power from battery pack 110.

Battery pack 110 may include at least two connectors where voltage of battery pack 110 may be measured. This may include a connector 118 for measuring or sensing the voltage of battery pack 110 as a whole, $V_{pack}$. Connector 118 may be directly coupled to battery control board 116. Battery pack 110 may also include a separate and distinct connector 114 for measuring or sensing the voltage of cells 112 of battery pack 110, $V_{cell}$. The term connector may refer to a pin, wire, printed circuit, or any other electrical coupling such that an electrical signal such as voltage may be measured.

Power consuming device 120 may be any system, apparatus, or device configured to utilize the electrical power provided by battery pack 110. This may include an information handling system, which may require power for components such as one or more displays, processors, storage media, memory, or other components. Power consuming device 120 may include a power management integrated circuit (PMIC) 122 and a charge monitor circuit (124). These circuits may be distinct and separate from battery pack 110.

PMIC 122 may be any system, apparatus, or device configured to manage power requirements of power consuming device 120. PMIC 122 may be implemented as an integrated circuit (IC) (for example, field-programmable gate arrays (FPGAs) or application-specific ICs (ASICs)), a system block in a system-on-a-chip device, or a processor executing instructions. PMIC 122 may perform tasks associated with power requirements of power consuming device 120, for example, controlling the flow and direction of electrical power, power conversion (such as DC to DC conversion), battery charging, power-source selection (for example, between one or more battery packs 110 and power from a 120 V A/C socket), voltage scaling (for example, between 5 V, 3.3 V, and 1.8 V), power sequencing, battery management, or other power requirements tasks. In some embodiments, PMIC 122 may be electrically coupled to connector 118 such that PMIC may measure or sense the voltage of the battery pack, $V_{pack}$. PMIC 122 may also instruct power consuming device 120 when there is insufficient power remaining in battery pack 110, and thus to shut down, hibernate, or otherwise go to a reduced power consumption state or to a state in which it will stop receiving power altogether. In some embodiments, PMIC 122 may perform certain functions based on voltage readings at connector 118, including but not limited to decreasing an allowable current draw from battery pack 110, activating a cooling feature (like a fan), or activating a heating feature.

Charge monitor circuit 124 may be any system, apparatus, or device configured to monitor the charge remaining in battery pack 110, or monitoring the state of charge (SOC). This may include continuous or periodic monitoring of battery output current, voltage, or both (for example, by coulomb counting). This may include directly measuring $V_{cell}$ at connector 114. In some embodiments, charge monitor circuit 124 may also monitor for temperature through the use of periodic voltage measurements, a thermometer, or any other method to correct for variations in temperature variations. Charge monitor circuit 124 may also analyze and compare monitored values to historic values or predicted models relative to SOC of battery pack 110. For example, charge monitor circuit 124 may continuously monitor the output current and voltage and determine an amount of charge remaining. Charge monitor circuit 124 may determine the remaining life of battery pack 110 based on the voltage reading at connector 114. Remaining life may refer to the amount or percentage of time remaining that a battery may safely provide power, the amount or percentage of voltage drop remaining over which a battery may safely provide power, or an amount or percentage of discharge capacity remaining that a battery may safely provide power. Charge monitor circuit 124 may report any data, analysis, or value it performs to PMIC 122. For example, charge monitor circuit 124 may report the remaining life of battery pack 110, the SOC of battery pack 110, a percent of charge remaining, a current voltage usage, or any other analysis or value measured or monitored by charge monitor circuit 124. These values may be reported to PMIC 122, some other component of system 100, or any combination thereof. In some embodiments, charge monitor circuit 124 may be electrically coupled to connector 114 such that charge monitor circuit 124 may directly measure or sense the voltage of the battery cells, $V_{cell}$. In some embodiments, charge monitor circuit 124 may be implemented as a fuel gauge circuit or gas gauge circuit. In some embodiments, charge monitor circuit 124 may have a set or predetermined number of pins or electrical connections and may reassign one of those pins to connect to connector 114. In some embodiments, PMIC 122 may update and extend the operation time available for power consumption device 110 in response to the remaining life.

Battery pack 110 may be without circuitry to affirmatively determine the amount of charge remaining in battery cells 112, and may also be without other control, processing, or communication circuitry to proactively communicate information to power consumption device 120. For example, battery controller board 116 may have very limited or no processing capability and may only perform a small number of limited tasks. Such a battery pack 110 may be referred to as a "dumb" battery. A dumb battery may be a battery without the functionality of PMIC 122 or charge monitor circuit 124 integrated with battery pack 110, while a battery with such functionality may be referred to as a "smart" battery. While lacking some functionality enjoyed by smart batteries, dumb batteries may be less expensive to produce and acquire than smart batteries.

Figure 2:
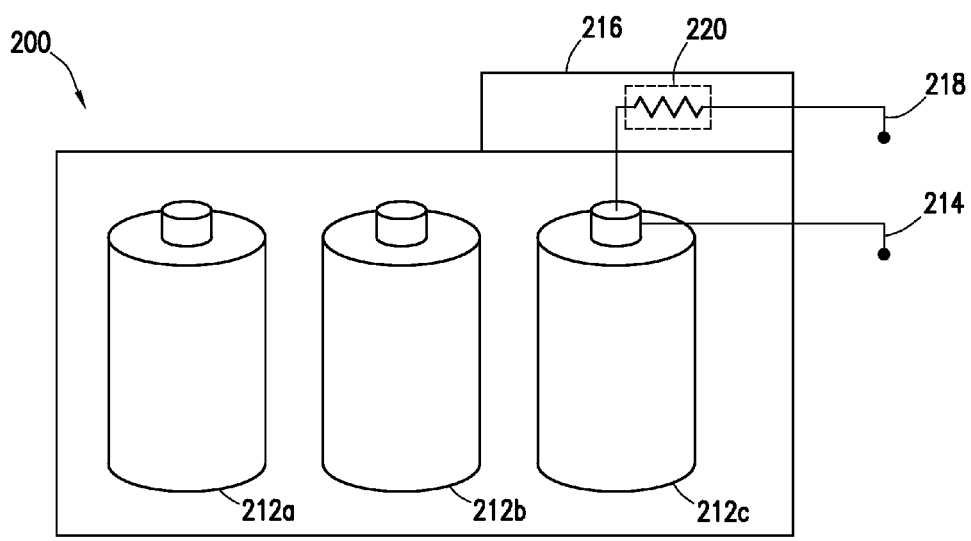
FIG. 2 illustrates an example of a battery pack, in accordance with some embodiments of the present disclosure.

FIG. 2 illustrates an example of a battery pack 200, in accordance with some embodiments of the present disclosure. As shown in FIG. 2, battery pack 200 may include one or more cells 212 (for example cells 212a-c). Battery pack 200 may be comparable to battery pack 110 and cells 212 may be comparable to cells 112 of FIG. 1. There may be a connector 214 directly connected to one or more of cells 212 of battery pack 200 and operable to facilitate the sensing or measuring of voltage at the connector. Connector 214 may be comparable to voltage sensing connector 114 of FIG. 1, for example, to facilitate the measure or sense of $V_{cell}$. Battery pack 200 may also include a battery controller board 216. Battery controller board 216 may be comparable to battery controller board 116 of FIG. 1. Battery pack 200 may also include a connector 218 coupled to battery controller board 216 to facilitate the sensing or measuring of $V_{pack}$. Connector 218 may be comparable to connector 118 of FIG. 1.

As shown in FIG. 2, in some embodiments, battery controller board 216 may be conceptually thought of as a resistor 220. A resistor may be any system, device or apparatus that includes at least two terminals and opposes an electric current by producing a voltage drop between its terminals in proportion to the current. While it is recognized that battery controller board 116 may include components such as wires, fuses, current sense resistors, or the like, each of those components will have their own resistance, and thus the entire battery controller board 116 may be treated electrically and conceptually as a single resistor 220. Thus, as the current load across resistor 220 increases, the voltage drop across resistor 220 proportionally increases. Additionally, as the temperature increases, the resistance of resistor 220 also increases. Thus, as the temperature increases, the voltage drop across resistor 220 also increases. Because of the voltage drop across battery controller board 216, this may cause a gap to exist between the voltage measured for battery pack 200 as a whole, $V_{pack}$, and the voltage measured for battery cells 212, $V_{cell}$.

A gap between the measured values of $V_{pack}$ and $V_{cell}$ may have implications in the operation of PMIC 122. For example, if PMIC 122 performed a reduced power or shutdown command based on the voltage reading of $V_{pack}$ rather than $V_{cell}$, there may be some additional battery capacity that could be safely utilized before shifting to the reduced power or shutdown state. As the gap becomes larger (for example due to temperature or current draw as explained above), the amount of battery capacity left unused increases. Stated another way, with reference to FIG. 1, because of the voltage drop across battery controller board 116, PMIC 122 may instruct power consuming device 120 to shut down too early, the size of the gap between $V_{pack}$ and $V_{cell}$ informing how early. For this reason, utilizing the reading at $V_{cell}$ may improve battery discharge performance.

Figure 3:
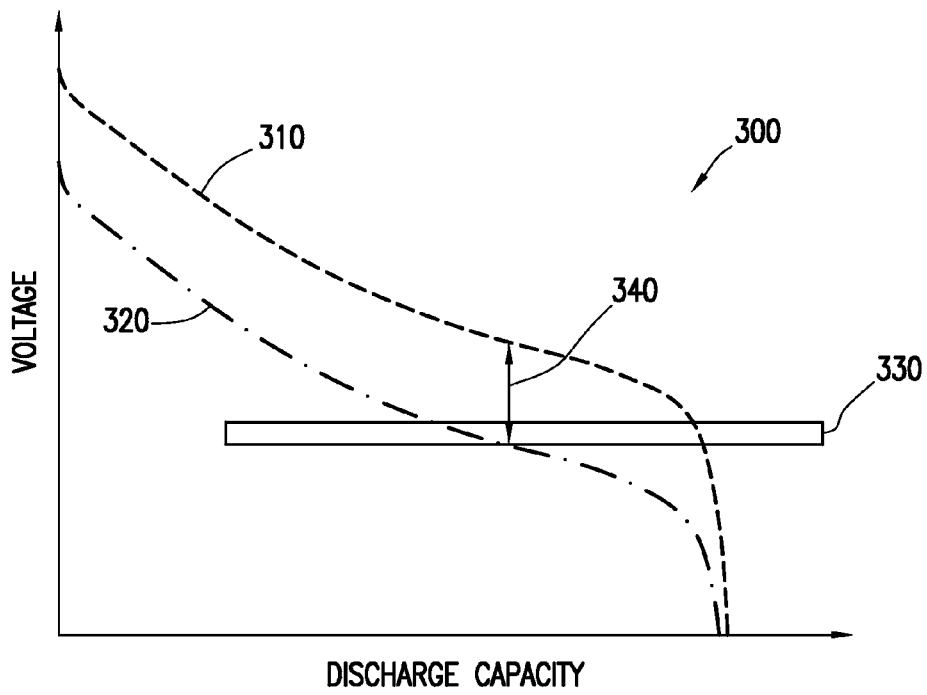
FIG. 3 illustrates an example of a graphical depiction of voltage readings at a cell and at a battery controller board, in accordance with some embodiments of the present disclosure.

FIG. 3 illustrates an example of a graphical depiction of voltage readings at a cell and at a battery controller board, in accordance with some embodiments of the present disclosure. For example, FIG. 3 provides a graphical depiction of the phenomenon described above. Graph 300 includes voltage along the x-axis and discharge capacity along the y-axis. The voltage reading of $V_{cell}$ is depicted as the dashed line 310. The voltage reading of $V_{pack}$ is depicted as the dashed and dotted line 320. As can be seen in FIG. 3, both start at a high voltage and as the discharge capacity decreases, the voltage continues to decrease. When the voltage reading drops below a certain threshold 330, a PMIC of the system may instruct the power consuming device to shut down or go to a reduced power consumption state. As illustrated by gap 340, $V_{pack}$ may be measuring too low compared to $V_{cell}$. Thus, it may be advantageous to directly measure $V_{cell}$ using the connectors described above. Stated another way, if using $V_{pack}$ (320) for comparison to threshold 330, the system may miss a large portion of potential discharge capacity that may be regained if the system uses $V_{cell}$ (310) for comparison to threshold 330.

With reference to FIG. 1, because of potential increases on system resources for system 100, it may be desirable to monitor voltage at $V_{cell}$ only when operating in circumstances in which there is a significant gap between $V_{pack}$ and $V_{cell}$. For example, if the current draw is not very large or the temperature is not very high, the reading of $V_{pack}$ may be sufficient for the system to operate in a reasonable way without giving up too much remaining discharge capacity. As one specific example of how this may be implemented, PMIC 122 or charge monitor circuit 124 may monitor the current draw from battery pack 110. If the current draw is below a certain circuit draw threshold, system 100 may only utilize $V_{pack}$ to determine if any action such as a shutdown needs to be taken. However, if the current draw is above the threshold, system 100 may utilize the voltage reading at $V_{cell}$ to utilize improved performance. By way of another example, if the operating temperature is above a certain threshold, system 100 may utilize the more precise voltage reading at $V_{cell}$ while if below the temperature threshold, system 100 may use the voltage reading at $V_{pack}$. It will be appreciated that the same concept may be implemented using a combination of the above factors, such as a lower current draw coupled with a lower temperature threshold, or a sliding scale involving both quantities.

Figure 4:
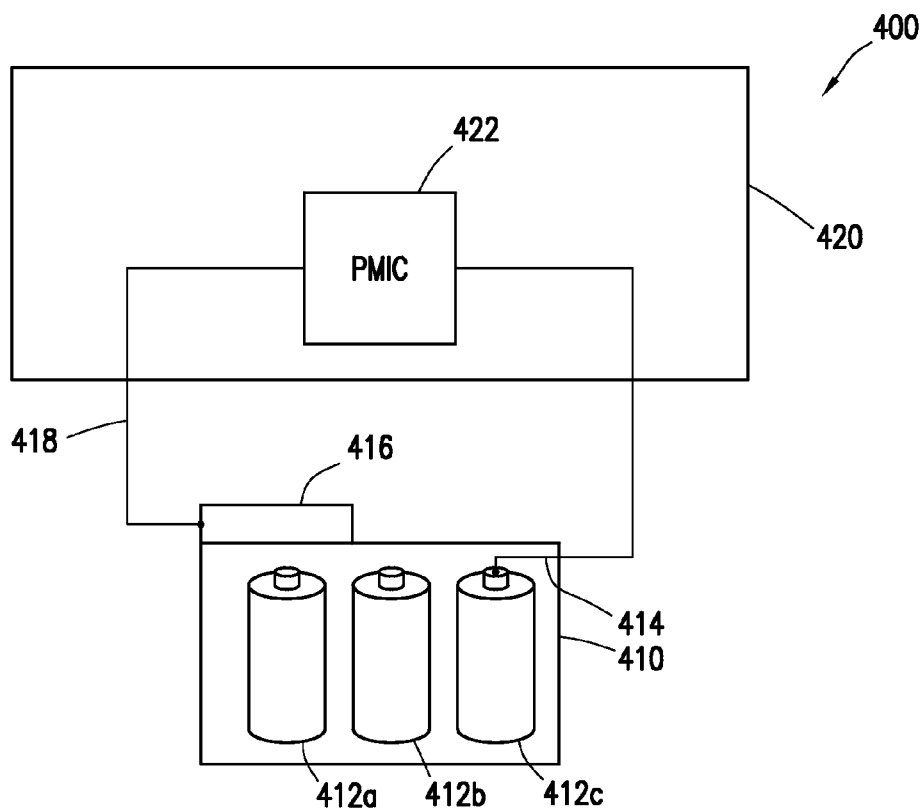
FIG. 4 illustrates an alternative example of a system using a battery with improved discharge performance, in accordance with some embodiments of the present disclosure.

FIG. 4 illustrates an alternative example of a system 400 using a battery with improved discharge performance, in accordance with some embodiments of the present disclosure. Several of the components of system 400 are comparable to components of system 100 illustrated in FIG. 1. System 400 may include a battery pack 410 (comparable to battery pack 110) including one or more cells 412a-c (comparable to cells 112a-112c) and a battery control board 416 (comparable to battery control board 116). System 400 may also include a power consuming device 420 (comparable to power consuming device 120). However, in system 400, rather than having discrete components for PMIC and charge monitor circuit, the functionality of the charge monitor circuit has been included in PMIC 422. In such an embodiment, PMIC 422 is connected to both connecter 414 (comparable to connector 114) and connector 418 (comparable to connector 118). In such an embodiment, PMIC 422 may reassign a preexisting electrical connection or pin to be dedicated to connector 414.

Figure 5:
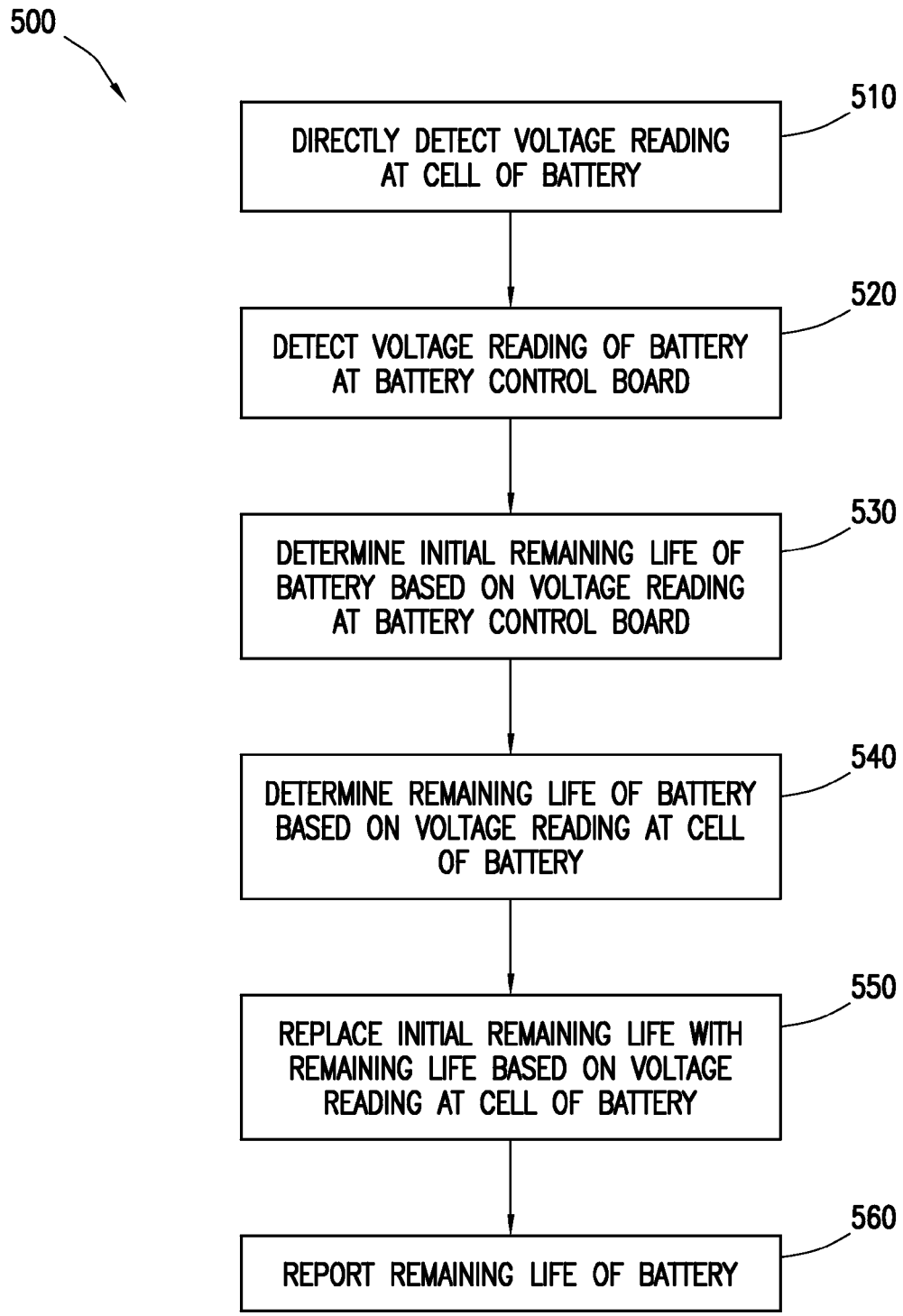
FIG. 5 illustrates an example method, in accordance with some embodiments of the present disclosure.

FIG. 5 illustrates an example method, in accordance with some embodiments of the present disclosure. At operation 510, a system directly detects the voltage reading at one or more of the cells of a battery. The voltage may be read at a connector directly connected to one or more of the cells and accessible by a charge monitor circuit or other component of a power consuming device. A charge monitor circuit, or a PMIC which includes the functionality of a charge monitor circuit are examples of components of a system that may detect such a voltage reading.

At operation 520, the system also detects a voltage reading of a battery pack by detecting the voltage at a battery control board, $V_{pack}$. The voltage may be read at a connector coupled to the battery control board of the battery pack by a PMIC of a power consuming device.

At operation 530, the system may determine an initial remaining life of the battery pack based on the voltage reading at the battery control board. For example, a PMIC may utilize $V_{pack}$ to determine an initial remaining life of the battery pack.

At operation 540, the system may determine the remaining life based on the voltage reading at the cell of the battery. For example, a PMIC or charge monitor circuit may utilize $V_{cell}$ to determine the remaining life of the battery. At operation 550, the system may replace the initially calculated remaining life with the newly-calculated remaining life. Stated another way, the system may initially have a remaining life determination based on $V_{pack}$ but once the remaining life is calculated based on $V_{cell}$, the new remaining life determination based on $V_{cell}$ may be used to replace the initial remaining life determination based on $V_{pack}$.

At operation 550, the system may report the remaining life of the battery pack from the charge monitor circuit to the PMIC. For example, the charge monitor circuit may send the PMIC a message with the remaining life of the battery pack. This may be between components of system 100, or may be between different functionalities of a single component. For example, in embodiments in which the PMIC also includes the expanded functionalities of a charge monitor circuit, the charge monitor circuit capability may report that information to other components of the PMIC. In some embodiments, the PMIC may update and extend the operation time available for the power consumption device in response to the updated remaining life. For example, with reference to FIG. 3, when first expecting to issue a shutdown command at the point when $V_{pack}$ 320 crosses threshold 330, instead, the operation time may be extended until the time when $V_{cell}$ 310 crosses threshold 330.

With respect to the operations articulated in FIG. 5, it will be appreciated that not all of the operations shown need be performed and other operations not shown may also be performed. For example, operations 530 and 550 may be omitted and the process may still be within the scope of the present disclosure. Additionally, the order of certain operations may be changed. For example, operations 510 and 520 may be done in any order, and operations 530 and 540 may be done in any order.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, although this disclosure describes and illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method of measuring voltage of a battery in an information handling system, the method comprising:
   directly detecting a voltage reading at one or more cells of the battery by a charge monitor circuit, the charge monitor circuit separate from the battery;
   detecting a voltage reading at a battery control board of the battery by a power management circuit, the power management circuit separate from the battery;
   determining an initial remaining life of the battery based at least on the voltage reading at the battery control board;
   determining a remaining life of the battery based on at least the voltage reading at the one or more cells of the battery by the charge monitor circuit;
   reporting the remaining life of the battery from the charge monitor circuit to the power management circuit; and
   replacing the initial remaining life based at least on the voltage reading at the battery control board with the remaining life based at least on the voltage reading at the one or more cells of the battery when the remaining life is greater than the initial remaining life.

2. The method of claim 1, wherein the charge monitor circuit and the power management circuit are part of a single integrated circuit.

3. The method of claim 2, wherein the power management circuit reassigns a pre-existing electrical connection to correspond to the cell voltage sensing connector.

4. The method of claim 1, further comprising extending an operation time of the information handling system based on the remaining life of the battery.

5. The method of claim 1, wherein the charge monitor circuit reassigns a pre-existing electrical connection to correspond to the cell voltage sensing connector.

6. The method of claim 1, further comprising the power management circuit modifying operation of the information handling system based on the voltage reading at the battery control board.

7. The method of claim 6, wherein modifying the operation of the system includes decreasing an allowable current draw from the battery or activating a cooling or heating feature of the system.

8. The method of claim 1, wherein the method is only performed when the information handling system is operating above a certain temperature threshold, is drawing current above a current threshold, or a combination thereof.

9. A system for battery monitoring comprising:
   a battery comprising:
   one or more rechargeable cells;
   a battery controller board;
   a battery voltage sensing connector connected to the battery controller board; and
   a cell voltage sensing connector connected directly to the one or more rechargeable cells and configured to output a voltage reading at the one or more cells;
   a power management circuit separate from the battery, the power management circuit configured to detect a voltage reading at the battery voltage sensing connector;
   a charge monitor circuit separate from the battery, the charge monitor circuit configured to:
   detect the voltage reading at the cell voltage sensing connector;
   determine a remaining life of the battery based at least on the voltage reading at the cell voltage sensing connector; and
   report the remaining life of the battery to the power management circuit,
   wherein the power management circuit is further configured to:
   determine an initial remaining life of the battery based at least on the voltage reading at the battery voltage sensing connector; and
   replace the initial remaining life based at least on the voltage reading at the battery voltage sensing connector with the remaining life based at least on the voltage reading at the cell voltage sensing connector when the remaining life is greater than the initial remaining life.

10. The system of claim 9, wherein the power management circuit and the charge monitor circuit are part of a single integrated circuit.

11. The system of claim 10, wherein the power management circuit reassigns a pre-existing electrical connection to correspond to the cell voltage sensing connector.

12. The system of claim 9, the power management circuit further configured to extend an operating time of the system based on the remaining life of the battery.

13. The system of claim 9, wherein the charge monitor circuit reassigns a pre-existing electrical connection to correspond to the cell voltage sensing connector.

14. The system of claim 9, wherein the power management circuit is further configured to modify operation of the system based on the voltage reading at the battery voltage sensing connector.

15. The system of claim 14, wherein modifying the operation of the system includes decreasing an allowable current draw from the battery or activating a cooling or heating feature of the system.

16. The system of claim 9, wherein the cell voltage sensing connector is only utilized when the information handling system is operating above a certain temperature threshold, is drawing current above a current threshold, or a combination thereof.

17. A battery comprising:
   one or more rechargeable cells;
   a battery controller board;
   a battery voltage sensing connector connected to the battery controller board and configured to output the voltage at the battery controller board; and
   a cell voltage sensing connector connected directly to the one or more rechargeable cells and configured to output the voltage at the one or more cells;

wherein the battery is configured to provide the voltage at the one or more cells to a charge monitor circuit separate from the battery such that the charge monitor circuit may determine a remaining life of the battery based at least on the voltage at the one or more cells, wherein the battery is configured to provide the voltage at the battery controller board to a power management circuit separate from the battery such that the power management circuit may determine an initial remaining life of the battery based at least on the voltage at the battery controller board; and wherein the initial remaining life of the battery based at least on the voltage at the battery controller board is replaced with remaining life of the battery based at least on the voltage at the one or more cells when the remaining life is greater than the initial remaining life.

18. The battery of claim 17, wherein the battery is configured to safely provide current above a current threshold, operate above a temperature threshold, or a combination thereof.

* * * * *